United States Patent
Hineman et al.

(10) Patent No.: US 6,379,872 B1
(45) Date of Patent: Apr. 30, 2002

(54) ETCHING OF ANTI-REFLECTIVE COATINGS

(75) Inventors: Max Hineman; Brad Howard, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/141,376

(22) Filed: Aug. 27, 1998

(51) Int. Cl.[7] ................................................ G03C 5/00
(52) U.S. Cl. ........................ 430/316; 430/313; 430/317; 430/323
(58) Field of Search .................. 430/311, 313, 430/316, 317, 323, 950, 322; 216/41, 59, 67

(56) References Cited

U.S. PATENT DOCUMENTS

| | | | |
|---|---|---|---|
| 4,312,732 A | * 1/1982 | Degenkolb et al. | .... 204/192.33 |
| 5,514,247 A | * 5/1996 | Shan et al. | ............... 216/67 |
| 5,545,512 A | * 8/1996 | Nakato | ............... 430/323 |
| 5,593,725 A | * 1/1997 | Park et al. | ............. 427/160 |
| 5,763,327 A | 6/1998 | Blasingame et al. | ........ 438/717 |
| 5,773,199 A | 6/1998 | Linliu et al. | ............. 430/316 |

* cited by examiner

Primary Examiner—Mark F. Huff
Assistant Examiner—Saleha R. Mohamedulla

(57) ABSTRACT

A method of removing regions of an anti-reflective coating includes etching the anti-reflective coating with a fluorinated hydrocarbon-based plasma etch and etching the anti-reflective coating with an oxygen-based plasma etch. In some implementations, the oxygen-based plasma etch is performed following the fluorinated hydrocarbon-based etch. The technique can be used to remove regions of an anti-reflective coating so that a more uniform and controlled etch of an underlayer can subsequently be performed. The disclosed technique is particularly useful for etching organic or organometallic anti-reflective layers, but can be used to etch other anti-reflective layers as well. In addition, the techniques are particularly advantageous for etching anti-reflective coatings disposed on certain oxide and nitride layers, although the underlayer can be formed of other materials as well.

41 Claims, 3 Drawing Sheets

ETCHING OF ANTI-REFLECTIVE COATINGS

BACKGROUND

The present invention relates generally to the etching of anti-reflective coatings.

The requirements for high density, high performance ultra-large scale integrated semiconductor devices place unique demands on the conductive patterns used in such devices, including, for example, increasingly denser arrays with minimal spacing between conductive lines. The demands for such devices have increased with the advent of sub-half micron manufacturing technology.

Photolithography represents one technique which typically is used in the fabrication of such devices. Anti-reflective coatings (ARCs) are sometimes incorporated into a device to reduce notching caused by reflections of the photolithographic light source from previously-formed device features. Thus, for example, in i-line photolithography, an i-line photoresist can be applied over a dielectric layer, such as an oxide or nitride layer, with an organic ARC formed between the photoresist and the dielectric layer.

To transfer a pattern from a photolithographic mask to a dielectric or other underlayer disposed beneath an ARC, the ARC layer must be etched or removed selectively. Preferably, etching of the ARC should be completed prior to significant etching of the underlayer. That permits subsequent etching of the underlayer subsequently to be carried out in a uniform and controlled manner.

Several techniques have been used to etch the ARC. Those processes, however, have presented various difficulties. For example, some techniques tend to etch the sidewalls of the photoresist pattern as well as the ARC, thereby resulting in a deterioration and widening of critical dimensions formed in the underlayer. Other techniques can etch an oxide or nitride underlayer, as well as the ARC. If the latter techniques are used, the depth of the etch through the ARC and into the oxide or nitride layer will vary depending on variations in pattern density and the dimensions of the device features. The subsequently-etched underlayer exhibits variations in the etch profiles as a result of exposure to different etching chemistries. Such variations in the depth of the etch make the fabrication process more difficult to control and lead to the formation of non-uniform device features.

SUMMARY

In general, a technique is disclosed for removing regions of an anti-reflective coating so that a more uniform and controlled etch of an underlayer can subsequently be performed. The disclosed technique is particularly useful for etching organic or organometallic anti-reflective layers, but can be used to etch other anti-reflective layers as well. In addition, the techniques are particularly advantageous for etching anti-reflective coatings disposed on certain oxide and nitride layers, although the underlayer can be formed of other materials as well.

According to one aspect, a method of removing regions of an anti-reflective coating includes etching the anti-reflective coating with a fluorinated hydrocarbon-based plasma etch and etching the anti-reflective coating with an oxygen-based plasma etch. In some implementations, it is advantageous to perform the fluorinated hydrocarbon-based plasma etch first, and subsequently to perform the oxygen-based plasma etch.

In various implementations, the method includes one or more of the following features. If the anti-reflective coating is disposed on an underlayer, the fluorinated hydrocarbon-based plasma etch can be halted prior to any etching of the underlayer. The fluorinated hydrocarbon-based plasma etch can be performed, for example, for a pre-selected duration. The oxygen-based plasma etch then can be performed to expose regions of the underlayer below the anti-reflective coating.

Alternatively, if the fluorinated hydrocarbon-based plasma is capable of etching the underlayer, etching of a portion of the underlayer can be detected during performance of the fluorinated hydrocarbon-based plasma etch, and the fluorinated hydrocarbon-based plasma etch can be halted after etching of the underlayer is detected. In yet other implementations, near-completion of the etching of the anti-reflective coating can be detected, and the fluorinated hydrocarbon-based plasma etch then can be halted. Etching of the underlayer and/or the near-completion of etching of the anti-reflective coating can be detected, for example, through optical or residual gas analysis techniques.

In some implementations, a photoresist mask pattern can be provided on the anti-reflective coating to define the regions of the anti-reflective coating to be removed. The etching steps can be performed, for example, by reactive ion etch processes.

As previously noted, the anti-reflective coating can include an organic or organometallic material. Etching the anti-reflective coating with a fluorinated hydrocarbon can include, for example, providing a gaseous flow of one or more of carbon tetrafluoride ($CF_4$), perfluoro ethane ($C_2F_6$), and trifluoromethane ($CHF_3$). Other gases also can be used.

The techniques described above can be used, for example, to fabricate an integrated electrical device including a first layer. The method can include depositing an anti-reflective coating on the first layer and forming a mask pattern, such as a photoresist mask pattern, on the anti-reflective coating. The anti-reflective coating can be etched with a fluorinated hydrocarbon-based plasma etch and subsequently etched with an oxygen-based plasma etch to expose regions of the first layer. The exposed regions of the first layer then can be etched.

Other features and advantages will be readily apparent from the following description, the accompanying drawings, and the claims.

DETAILED DESCRIPTION

Figure 1:
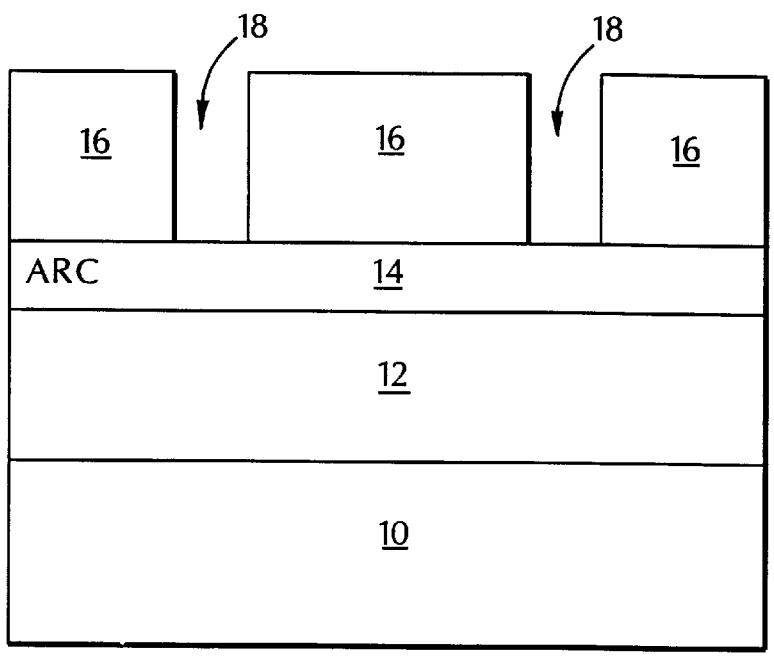
FIG. 1 illustrates an exemplary structure including an anti-reflective coating.

As shown in FIG. 1, a layer 12 which is to be etched is disposed on a semiconductor or other substrate 10. The substrate 10 can include, for example, one or more semiconductor layers or structures and may include active or operable portions of semiconductor devices. The layer 12 can include a dielectric, for example, an oxide such as silicon oxide ($SiO_2$) or a nitride such as silicon nitride (SiN). Alternatively, the layer 12 can be formed of other or different materials, including conductive materials. An ARC 14 is deposited on the layer 12 and can be a conventional organic or organometallic material applied, for example, by a spin-on technique (step 100). Such ARC materials are commercially available and include, for example, BARLi from Hoescht Celanese, as well as other ARC materials available from Shipley and Brewer Science. A photoresist mask pattern 16 is formed on the ARC 14 (step 102). Known techniques can be used to form the photoresist mask 16. In one particular implementation, the mask pattern 16 defines holes for conductive contacts through the layer 12. In some implementations, the mask pattern 16 defines other device features.

For many applications, the ARC 14 can be deposited at a thickness of between 600 to 2,000 angstroms (Å). The thickness of the ARC 14, however, generally will depend on the wavelength used during photolithography as well as the relative indices of refraction of the photoresist and the ARC. Thus, thicker or thinner ARCs may be appropriate in particular applications.

Figure 2:
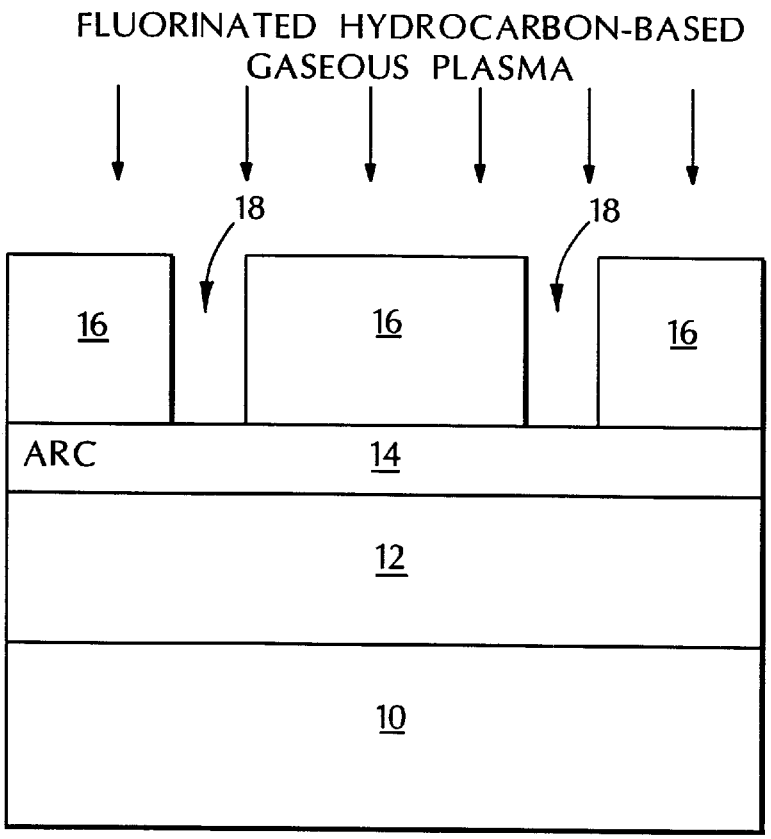
FIG. 2 illustrates etching of the anti-reflective coating with a fluorinated hydrocarbon-based gaseous plasma according to the invention.

To provide a more uniform and predictable etch through the ARC 14, two plasma etching processes are performed sequentially. The first plasma etch process uses a gaseous plasma that is substantially inert with respect to the photoresist mask 16. For example, as indicated by FIG. 2, the ARC 14 initially can be etched in a reactive ion etch (RIE) chamber using a gaseous plasma based on fluorinated hydrocarbons, such as carbon-tetrafluoride ($CF_4$), perfluoro ethane ($C_2F_6$) or trifluoromethane ($CHF_3$), among others (step 104). One or more inert background gases such as argon (Ar) or helium (He) also can be provided to the chamber during the first plasma etch process. The first plasma etch process etches the ARC 12 quite rapidly, but does not significantly etch the sidewalls of the photoresist mask pattern 16. Thus, the first plasma etch process can help achieve a relatively high throughput, but does not adversely affect or significantly deteriorate the critical dimensions defined by the mask pattern 16.

Figure 3:
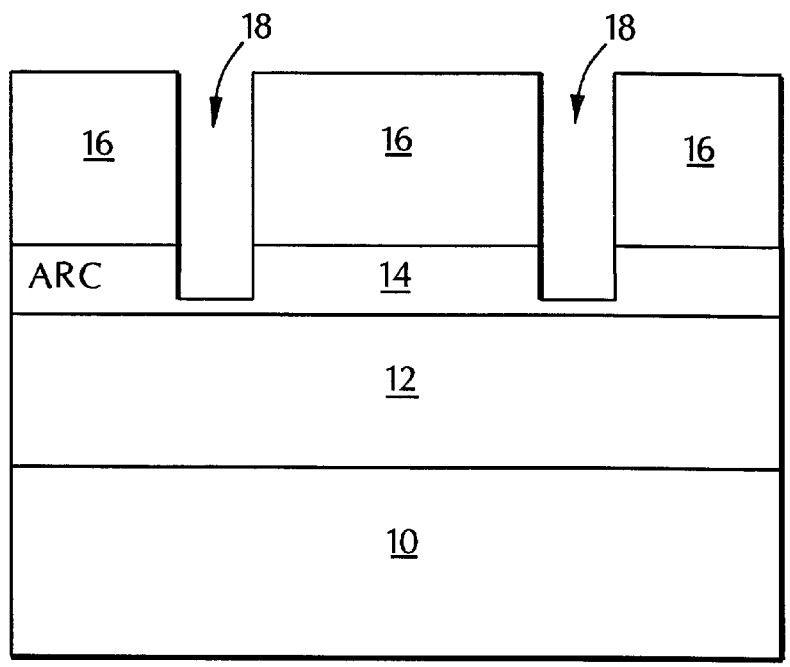
FIG. 3 illustrates the structure of FIG. 1 after completion of the fluorinated hydrocarbon-based etch according to one embodiment of the invention.

Some materials, such as $Sio_2$ and SiN, can be etched by the fluorocarbon-based plasma etchants. Accordingly, as illustrated by FIG. 3, the first plasma etch process should be halted before etching of the ARC 14 is completed, in other words, before the material below each of the exposed regions 18 in the photoresist mask 16 has been etched through to the layer 12 (step 106). In general, it is desirable to use the first plasma etch to etch as much of the ARC 14 as possible, but to stop the first plasma etch process prior to any etching of the layer 12. A second plasma etch then can be used to complete the etching of the ARC 14.

In one implementation, for example, the first plasma etch process is stopped after a pre-selected duration has elapsed. The pre-selected duration can be determined experimentally and is chosen so that the first plasma etch process is completed prior to completion of the ARC etch. In one implementation which can be used if the fluorinated hydrocarbon plasma is capable of etching the underlayer 12, a sample substrate having an underlayer and ARC substantially identical to the underlayer 12 and ARC 14 is processed using the first plasma etch process to determine the pre-selected duration. An optical end-point detection technique or a residual gas analysis end-point detection technique, for example, can be used to determine when the first plasma etchant begins to etch the underlayer below the ARC on the sample substrate. A period of time equal to or somewhat less than the duration from commencement of the first plasma etch process until the onset of etching of the underlayer on the sample substrate can be used as the pre-selected duration.

Alternatively, in other embodiments, the first plasma etch process can be halted automatically once etching of any portion of the layer 12 beneath the ARC 14 is detected. An optical end-point detection apparatus, such as an optical emission spectrometer end-point detector, or a residual gas analysis end-point detector, can be coupled to the etch system controller for that purpose. For example, a significant change, such as an increase, in the level of emission of one or more by-products of the layer 12 would indicate that etching of the layer 12 has begun. In yet other implementations, the first plasma etch process can be halted automatically by detecting near-completion of the etching of the ARC 14. Near-completion of the etching of the ARC 14 can occur, for example, when at least a portion of the underlayer 12 becomes exposed during etching of the fluorinated hydrocarbon-based plasma etch. Near-completion of the etching of the ARC 14 can be detected, for example, by using an optical emission spectrometer to monitor the wavelength(s) of one or more by-products of the ARC 14. A significant change, such as a decrease, in the detected level(s) of emission for the monitored wavelength(s) indicates that at least a portion of the ARC 14 has been etched to the underlayer 12. The first etch process then can be halted.

Figure 4:
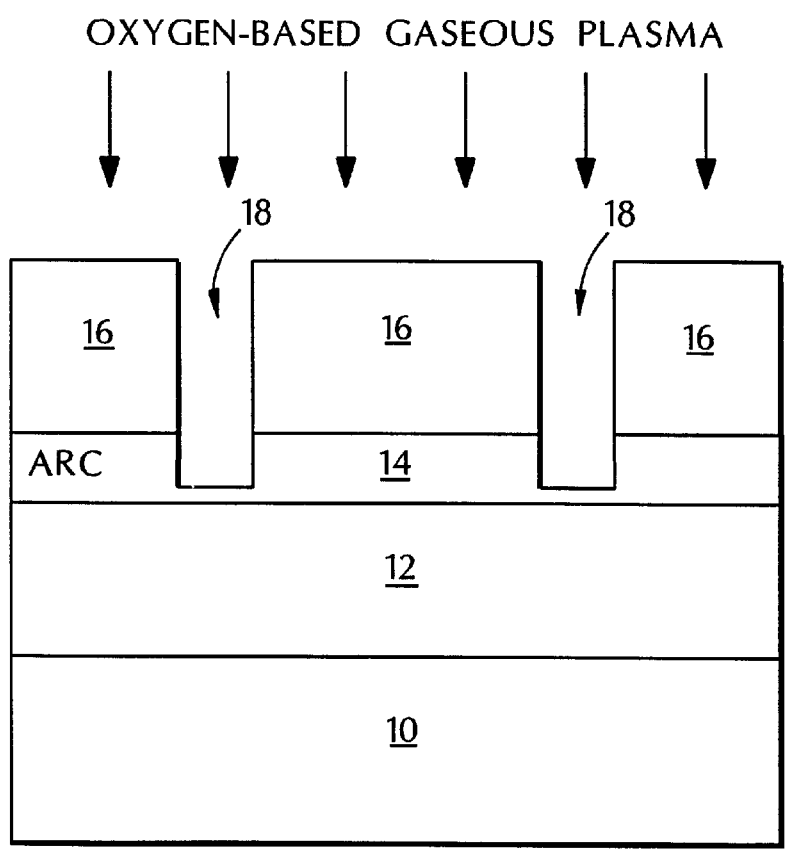
FIG. 4 illustrates subsequent etching of the anti-reflective coating with an oxygen-based gaseous plasma according to the invention.
Figure 5:
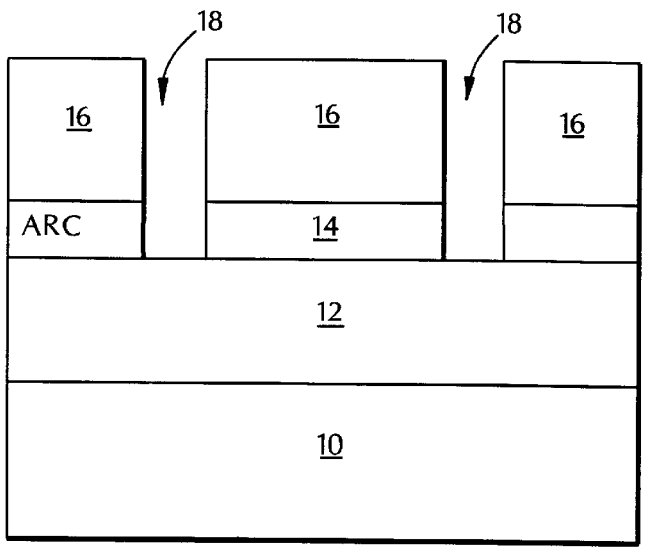
FIG. 5 illustrates the structure of FIG. 1 after completion of the oxygen-based etch according to one embodiment of the invention.
Figure 6:
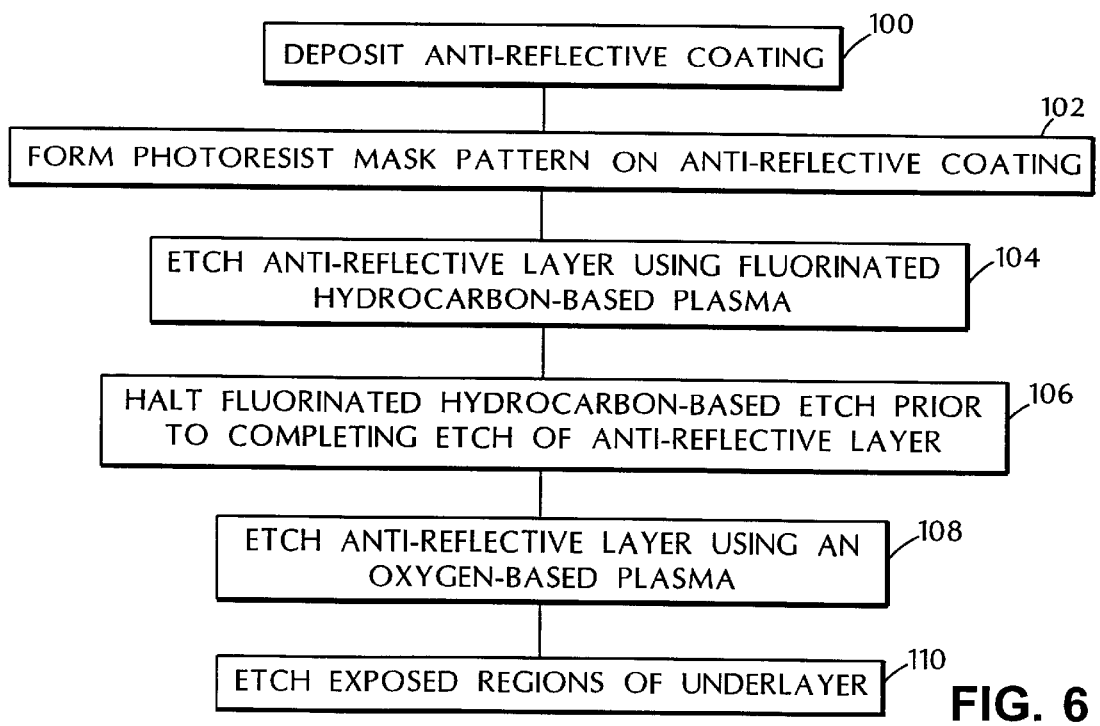
FIG. 6 is a flow chart showing steps of a method of etching an anti-reflective layer according to the invention.

Once the first plasma etch process is completed, the second plasma etch process is performed to complete the etching of the ARC 14 and to expose regions of the underlayer 12 defined by the openings 18 in the mask pattern 16 (step 108). The second plasma etch process should be substantially inert to the layer 12 so that etching of the ARC 14 can be completed without significant etching of the layer 12. For example, an oxygen-based RIE etch can serve as the second plasma etch process (see FIG. 4). One or more inert background gases such as Ar, He or nitrogen ($N_2$) also can be provided to the chamber during the second plasma etch process. Although the oxygen-based plasma will not generally etch a nitride or oxide layer 12, it may tend to etch the sidewalls of the photoresist mask pattern 16 somewhat. Accordingly, the second plasma etch process should be halted as soon as the ARC 14 has been completely etched through to the layer 12 (FIG. 5).

Once the second etch process is completed, the exposed regions of the underlayer 12 can be etched using any one of many known techniques (step 110). The particular technique used to etch the underlayer 12 depends, in part, on the material forming the underlayer as well as the overall process in which the foregoing technique is used. Specific processes for etching underlayers of various materials, including $SiO_2$ and SiN, are well-known and, therefore, are not described further.

Exemplary etches were performed on several samples having an organic anti-reflective coating with a thickness of approximately 620 Å and disposed on a layer of $SiO_2$. In each case, the ARC and $SiO_2$ layers were etched through small mask openings having a diameter of about 0.25 microns as well as through large mask openings having a diameter at least as large as about 1. Various samples were etched as described below.

The ARC of a first sample was etched using only an oxygen-based plasma for about 28 seconds. Oxygen gas ($O_2$) was flowed at about 15 sccm, and nitrogen gas ($N_2$) was flowed at about 45 sccm. The chamber pressure was approximately 30 milliTorr (mTorr) with about 400 Watts of RF power supplied to the chamber.

The ARC of a second sample was etched using only a fluorinated hydrocarbon-based plasma for about 60 seconds. $CF_4$ gas was flowed at about 60 sccm, and $CHF_3$ gas was flowed at about 40 sccm. In addition, Ar gas was flowed at about 80 sccm. The chamber pressure was approximately 120 mTorr with about 900 Watts of RF power supplied to the chamber.

The ARC of a third sample was etched using a fluorinated hydrocarbon-based plasma etch for about 40 seconds followed by an oxygen-based plasma etch for about 10 seconds. During the fluorinated hydrocarbon-based etch, $CF_4$ gas was flowed at about 60 sccm, and $CHF_3$ gas was flowed at about 40 sccm. In addition, Ar gas was flowed at about 80 sccm. The chamber pressure was approximately 120 mTorr with about 900 Watts of RF power supplied to the chamber. During the subsequent oxygen-based etch, $O_2$ was flowed at about 15 sccm, and nitrogen gas $N_2$ was flowed at about 45 sccm. The chamber pressure was approximately 30 mTorr with about 400 Watts of RF power supplied to the chamber.

In each case, following etching of the ARC, the $SiO_2$ layer was etched using a fluorocarbon-based etchant with a target average depth of about 5000 Å for the regions defined by the large mask openings having an initial diameter greater than about 1 micron. Following the $SiO_2$ etch, measurements were made to determine the average change $\Delta$ in the diameter of the small mask openings and to determine the effective difference in etch rate between the etch through the large mask openings and the etch through the small mask openings. The effective difference in etch rate, S, was calculated according to the following equation:

$$S=[(D_L-D_S)/D_L]\cdot 100\%,$$

where $D_L$ is the average overall depth of the etch through the large mask openings, and $D_S$ is the average overall depth of the etch through the small mask openings. In general, it is desirable for both $\Delta$ and S to be small. The results are summarized in TABLE 1.

TABLE 1

| | CHANGE IN DIAMETER OF SMALL OPENINGS ($\Delta$) | EFFECTIVE DIFFERENCE IN ETCH RATE (S) |
|---|---|---|
| SAMPLE 1 | 40 NANOMETERS | 8% |
| SAMPLE 2 | 10 NANOMETERS | 20% |
| SAMPLE 3 | 10 NANOMETERS | 10% |

As can be seen from TABLE 1, when only the oxygen-based plasma was used to etch the ARC (sample 1), the depth of the resulting overall etch was relatively uniform, as indicated by the value of 8% for S. The diameter of the small openings, however, changed significantly, thereby making it difficult to control the processing of small critical dimensions. On the other hand, when only the fluorinated hydrocarbon-based plasma was used to etch the ARC (sample 2), the size of the small openings increased by only about 10 nanometers (nm). However, the depth of the overall etch was much less uniform, due, in part, to the fact that the fluorinated hydrocarbon-based plasma tends to etch through regions of the ARC defined by the large mask openings somewhat more quickly than through regions of the ARC defined by the small mask openings. The fluorinated hydrocarbon-based etch subsequently begins to etch exposed regions of $SiO_2$ dielectric layer at several times the rate at which it continues to etch through the remaining regions of the ARC.

In contrast, when the ARC was etched with an initial fluorinated hydrocarbon-based plasma followed by an oxygen-based plasma (sample 3), the depth of the overall etch was relatively uniform, as indicated by the value of 10% for S. In addition, the diameter of the small mask openings changed by only about 10 nm, thereby preserving the size of critical dimensions. The use of the fluorinated hydrocarbon-based plasma allows most of the ARC to be etched with little or no adverse effects on the size of the critical dimensions. Additionally, subsequent etching of the ARC to expose regions of the dielectric underlayer using the oxygen-based plasma prevents etching of the $SiO_2$ until etching of the ARC is completed. That allows etching of the various regions of the $SiO_2$ to be commenced at the same time to provide a more uniform final etch.

In general, the first and second plasma etch processes can be performed in a single RIE chamber, magnetically-enhanced RIE chamber, inductively-coupled plasma RIE chamber or other suitable plasma etch chamber. Alternatively, the first and second plasma etch processes can be performed in separate chambers. Although the first and second plasma etch processes are performed sequentially, in some implementations, other processes or steps may be performed prior or subsequent to the first and second plasma etches, as well as between the first and second plasma etches. Moreover, although it is often desirable to perform the fluorinated hydrocarbon-based plasma etch prior to the oxygen-based plasma etch, the sequence can be reversed so that the oxygen-based plasma etch is performed first.

The techniques described above for etching an ARC can be used in the fabrication of electrical circuit elements and patterned layers within integrated circuits including, for example, dynamic random access memory (DRAM) integrated circuits, static random access memory (SRAM) integrated circuits, application specific integrated circuits (ASICs), and integrated circuits containing field effect transistors (FETs) or bipolar transistors (BPTs), as well as other integrated circuits and devices.

Other implementations are within the scope of the following claims.

What is claimed is:

1. A method of removing regions of an anti-reflective coating on an underlayer, said anti-reflective coating having an organic material composition throughout and being formed as a single layer, the method comprising:

providing a mask pattern directly on an upper surface of the anti-reflective coating having said organic material composition to define exposed regions of the anti-reflective coating to be removed, said mask pattern being formed as a single layer;

etching the anti-reflective coating with a plasma including a fluorinated hydrocarbon through said mask pattern;

halting the fluorinated hydrocarbon plasma etch once the anti-reflective coating has substantially been etched through, but prior to exposure of the underlayer; and etching the anti-reflective coating with a plasma including oxygen to expose regions of the underlayer below the anti-reflective coating.

2. The method of claim 1 wherein the fluorinated hydrocarbon plasma etch is performed for a pre-selected duration.

3. The method of claim 1 wherein said mask pattern comprises a photoresist mask pattern.

4. The method of claim 1 further comprising:
    detecting near-completion of the etching of the anti-reflective coating during performance of the fluorinated hydrocarbon plasma etch; and
    halting the fluorinated hydrocarbon plasma etch in response to detecting near-completion of the etching of the anti-reflective coating.

5. The method of claim 1 further comprising:
    monitoring at least one by-product of the anti-reflective coating during performance of the fluorinated hydrocarbon plasma etch; and
    halting the fluorinated hydrocarbon plasma etch in response to detecting a change in a level of a monitored by-product of the anti-reflective coating.

6. The method of claim 1 wherein the fluorinated hydrocarbon etch and the oxygen etch are achieved by a reactive ion etch process.

7. The method of claim 1 wherein etching the anti-reflective coating with a fluorinated hydrocarbon plasma etch includes providing a gaseous flow of carbon tetrafluoride ($CF_4$).

8. The method of claim 1 wherein etching the anti-reflective coating with a fluorinated hydrocarbon plasma etch includes providing a gaseous flow of perfluoro ethane ($C_2F_6$).

9. The method of claim 1 wherein etching the anti-reflective coating with a fluorinated hydrocarbon plasma etch includes providing a gaseous flow of trifluoromethane ($CHF_3$).

10. The method according to any one of claims 7, 8, or 9, wherein the underlayer includes a material comprising a nitride.

11. The method according to any one of claims 7, 8, or 9, wherein the underlayer includes a material comprising an oxide.

12. A method of fabricating an integrated electrical device having a first layer, the method comprising:
    depositing an anti-reflective coating on the first layer, said anti-reflective coating having an organic material composition throughout and being formed as a single layer;
    forming a mask pattern directly on an upper surface of the anti-reflective coating having said organic material composition;
    etching the anti-reflective coating with a plasma including a fluorinated hydrocarbon through said mask pattern;
    halting the fluorinated hydrocarbon plasma etch once the anti-reflective coating has substantially been etched through, but prior to exposure of the first layer;
    subsequently etching the anti-reflective coating with a plasma including oxygen to expose regions of the first layer without substantially altering the material composition of said mask pattern; and
    etching the exposed regions of the first layer.

13. The method of claim 12 wherein the fluorinated hydrocarbon plasma etch is performed for a pre-selected duration.

14. A method of removing regions of an anti-reflective coating on an underlayer, said anti-reflective coating having an organic material composition throughout and being formed as a single layer, the method comprising:
    providing a mask pattern over the anti-reflective coating having said organic material composition to define the regions of the anti-reflective coating to be removed, said mask being formed as a single layer;
    etching the anti-reflective coating with a plasma including a fluorinated hydrocarbon through said mask pattern;
    halting the fluorinated hydrocarbon plasma etch once the anti-reflective coating has substantially been etched through, but prior to exposure of the underlayer; and
    etching the anti-reflective coating with a plasma including oxygen to expose regions of the underlayer below the anti-reflective coating.

15. The method of claim 14 wherein the fluorinated hyrdrocarbon based plasma etch is performed for a pre-selected duration.

16. The method of claim 14 wherein said mask pattern comprises a photoresist mask pattern.

17. The method of claim 14 further comprising:
    detecting near-completion of the etching of the anti-reflective coating during performance of the fluorinated hydrocarbon plasma etch; and
    halting the fluorinated hydrocarbon plasma etch in response to detecting near-completion of the etching of the anti-reflective coating.

18. The method of claim 14 further comprising:
    monitoring at least one by-product of the anti-reflective coating during performance of the fluorinated hydrocarbon plasma etch; and
    halting the fluorinated hydrocarbon plasma etch in response to detecting a change in a level of a monitored by-product of the anti-reflective coating.

19. The method of claim 14 wherein the fluorinated hydrocarbon etch and the oxygen etch are achieved by a reactive ion etch process.

20. The method of claim 14 wherein etching the anti-reflective coating with a fluorinated hydrocarbon plasma etch includes providing a gaseous flow of carbon tetrafluoride ($CF_4$).

21. The method of claim 14 wherein etching the anti-reflective coating with a fluorinated hydrocarbon plasma etch includes providing a gaseous flow of perfluoro ethane ($C_2F_6$).

22. The method of claim 14 wherein etching the anti-reflective coating with a fluorinated hydrocarbon plasma etch includes providing a gaseous flow of trifluoromethane ($CHF_3$).

23. The method according to any one of claims 20, 21, or 22, wherein the underlayer includes a material comprising a nitride.

24. The method according to any one of claims 20, 21, or 22, wherein the underlayer includes a material comprising an oxide.

25. A method of fabricating an integrated electrical device having a first layer, the method comprising:
    depositing an anti-reflective coating over the first layer, said anti-reflective coating having an organic material composition;
    forming a mask pattern directly on an upper surface of the anti-reflective coating having said organic material composition, exposing regions of said anti-reflective coating;
    etching the exposed regions of the anti-reflective coating with a plasma including a fluorinated hydrocarbon through said mask pattern;
    halting the fluorinated hydrocarbon plasma etch once the exposed regions of the anti-reflective coating have substantially been etched through, but prior to exposure of the first layer;
    subsequently etching the anti-reflective coating with a plasma including oxygen to expose regions of the first layer without removing said mask pattern; and
    etching the exposed regions of the first layer.

26. The method of claim 25 wherein the fluorinated hydrocarbon plasma etch is performed for a pre-selected duration.

27. A method of removing regions of an anti-reflective coating on an underlayer, said anti-reflective coating having an organic material composition, the method comprising:

providing a mask pattern directly on an upper surface of the anti-reflective coating having said organic material composition, said mask pattern directly exposing said regions of the anti-reflective coating to be removed;

etching the anti-reflective coating with a plasma including a fluorinated hydrocarbon through said mask pattern;

halting the fluorinated hydrocarbon plasma etch once the anti-reflective coating has substantially been etched through, but prior to exposure of the underlayer; and etching the anti-reflective coating with a plasma including oxygen to expose regions of the underlayer below the anti-reflective coating.

28. The method of claim 27 wherein the fluorinated hyrdocarbon based plasma etch is performed for a pre-selected duration.

29. The method of claim 27 wherein said mask pattern comprises a photoresist mask pattern.

30. The method of claim 27 further comprising:

detecting near-completion of the etching of the anti-reflective coating during performance of the fluorinated hydrocarbon plasma etch; and halting the fluorinated hydrocarbon plasma etch in response to detecting near-completion of the etching of the anti-reflective coating.

31. The method of claim 27 further comprising:

monitoring at least one by-product of the anti-reflective coating during performance of the fluorinated hydrocarbon plasma etch; and halting the fluorinated hydrocarbon plasma etch in response to detecting a change in a level of a monitored by-product of the anti-reflective coating.

32. The method of claim 27 wherein the fluorinated hydrocarbon etch and the oxygen etch are achieved by a reactive ion etch process.

33. The method of claim 27 wherein etching the anti-reflective coating with a fluorinated hydrocarbon plasma etch includes providing a gaseous flow of carbon tetrafluoride ($CF_4$).

34. The method of claim 27 wherein etching the anti-reflective coating with a fluorinated hydrocarbon plasma etch includes providing a gaseous flow of perfluoro ethane ($C_2F_6$).

35. The method of claim 27 wherein etching the anti-reflective coating with a fluorinated hydrocarbon plasma etch includes providing a gaseous flow of trifluoromethane ($CHF_3$).

36. The method according to any one of claims 33, 34, or 35, wherein the underlayer includes a material comprising a nitride.

37. The method according to any one of claims 33, 34, or 35, wherein the underlayer includes a material comprising an oxide.

38. A method of fabricating an integrated electrical device having a first layer, the method comprising:

depositing an anti-reflective coating on the first layer, said anti-reflective coating having an organic material composition;

forming a mask pattern directly on an upper surface of the anti-reflective coating having said organic material composition, said mask pattern directly exposing said regions of the anti-reflective coating to be removed;

etching the anti-reflective coating with a plasma including a fluorinated hydrocarbon through said mask pattern;

halting the fluorinated hydrocarbon plasma etch once the anti-reflective coating has substantially been etched through, but prior to exposure of the first layer;

subsequently etching the anti-reflective coating with a plasma including oxygen to expose regions of the first layer without removing said mask pattern during said etching; and etching the exposed regions of the first layer.

39. The method of claim 38 wherein the fluorinated hydrocarbon plasma etch is performed for a pre-selected duration.

40. A method of removing regions of an anti-reflective coating on an underlayer, said anti-reflective coating having an organic material composition throughout and being formed as a single layer, the method consisting essentially of:

providing a mask pattern directly on an upper surface of the anti-reflective coating having said organic material composition to define exposed regions of the anti-reflective coating to be removed, said mask pattern being formed as a single layer;

etching the anti-reflective coating with a plasma including a fluorinated hydrocarbon through said mask pattern;

halting the fluorinated hydrocarbon plasma etch once the anti-reflective coating has substantially been etched through, but prior to exposure of the underlayer; and etching the anti-reflective coating with a plasma including oxygen to expose regions of the underlayer below the anti-reflective coating.

41. A method of fabricating an integrated electrical device having a first layer, the method consisting essentially of:

depositing an anti-reflective coating on the first layer, said anti-reflective coating having an organic material composition throughout and being formed as a single layer;

forming a mask pattern directly on an upper surface of the anti-reflective coating having said organic material composition;

etching the anti-reflective coating with a plasma including a fluorinated hydrocarbon through said mask pattern;

halting the fluorinated hydrocarbon plasma etch once the anti-reflective coating has substantially been etched through, but prior to exposure of the first layer;

subsequently etching the anti-reflective coating with a plasma including oxygen to expose regions of the first layer without substantially altering the material composition of said mask pattern; and etching the exposed regions of the first layer.

* * * * *